United States Patent
Choi et al.

(10) Patent No.: US 8,247,815 B2
(45) Date of Patent: Aug. 21, 2012

(54) THIN FILM TRANSISTOR, AND DISPLAY APPARATUS HAVING THE SAME

(75) Inventors: Shin-Il Choi, Seoul (KR); Sang-Gab Kim, Seoul (KR); Hong-Kee Chin, Suwon-si (KR); Min-Seok Oh, Yongin-si (KR); Yu-Gwang Jeong, Yongin-si (KR); Seung-Ha Choi, Siheung-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/900,634

(22) Filed: Oct. 8, 2010

(65) Prior Publication Data

US 2011/0024752 A1 Feb. 3, 2011

Related U.S. Application Data

(62) Division of application No. 12/243,592, filed on Oct. 1, 2008, now Pat. No. 7,833,850.

(30) Foreign Application Priority Data

Oct. 31, 2007 (KR) .................. 10-2007-0110345

(51) Int. Cl.
*H01L 29/04* (2006.01)
*H01L 31/20* (2006.01)
*H01L 31/036* (2006.01)
*H01L 31/0376* (2006.01)

(52) U.S. Cl. ............ 257/57; 257/66; 257/761; 438/161; 438/201

(58) Field of Classification Search .................. 257/66, 257/761, 763, 57; 438/161, 189, 195, 201, 438/211
See application file for complete search history.

(56) References Cited

U.S. PATENT DOCUMENTS

| | | | |
|---|---|---|---|
| 6,218,206 B1 | 4/2001 | Inoue et al. | |
| 6,872,603 B2 | 3/2005 | Doi | |
| 7,615,867 B2 | 11/2009 | Kim et al. | |
| 7,706,424 B2* | 4/2010 | Amada et al. | 372/55 |
| 2007/0013625 A1* | 1/2007 | Hong | 345/87 |
| 2007/0109467 A1* | 5/2007 | Chang et al. | 349/106 |
| 2007/0236623 A1* | 10/2007 | Heo et al. | 349/42 |
| 2007/0295967 A1 | 12/2007 | Harada et al. | |
| 2008/0108229 A1 | 5/2008 | Tanaka et al. | |

FOREIGN PATENT DOCUMENTS

| | | |
|---|---|---|
| KR | 10-2004-0042872 | 5/2004 |
| KR | 10-2006-0078010 | 7/2006 |

* cited by examiner

*Primary Examiner* — Phuc Dang
(74) *Attorney, Agent, or Firm* — Cantor Colburn LLP

(57) ABSTRACT

A method of fabricating a thin film transistor includes forming a gate electrode on a substrate, forming a semiconductor layer on the gate electrode, forming a source electrode on the semiconductor layer, forming a drain electrode on the semiconductor layer spaced apart from the source electrode, forming a copper layer pattern on the source electrode and the drain electrode, exposing the copper layer pattern on the source electrode and the drain electrode to a fluorine-containing process gas to form a copper fluoride layer pattern thereon, and patterning the semiconductor layer.

3 Claims, 16 Drawing Sheets

50mT, 1000W
100CF$_4$/100 O$_2$, 60"

100mT, 1000W
400N$_2$, 60"

THIN FILM TRANSISTOR, AND DISPLAY APPARATUS HAVING THE SAME

CROSS REFERENCE TO RELATED APPLICATIONS

This application is a divisional application of U.S. application Ser. No. 12/243,592, now U.S. Pat. No. 7,833,850, filed on Oct. 1, 2008, which claims priority to Korean Patent Application No. 2007-110345, filed on Oct. 31, 2007, and all the benefits accruing therefrom under 35 U.S.C. §119, the contents of which in its entirety are herein incorporated by reference.

BACKGROUND OF THE INVENTION

1. Field of the Invention

The present invention relates to a thin film transistor. More particularly, the present invention relates to a thin film transistor having reduced corrosion of electrodes and wires during fabrication thereof, a method of fabricating the thin film transistor, and a display apparatus having the thin film transistor.

2. Description of the Related Art

In general, a display apparatus includes a substrate to display an image. The substrate includes a plurality of pixel areas in which the image is displayed. The pixel areas are defined by a plurality of wires. Each pixel area includes a thin film transistor.

To form wires and the thin film transistor, a conductive layer is formed on the substrate, and then the conductive layer is patterned. Semiconductor layers or insulating layers are formed above or under the thin film transistor formed on the substrate. Some of the semiconductor layers or the insulating layers are then patterned.

Thus, a plurality of patterning processes is performed to pattern the conductive layer, the semiconductor layers, and the insulating layers during a fabricating process of the display apparatus. Process gases or process solutions are used to pattern the above-mentioned layers during the patterning process. However, the process gases or process solutions applied to pattern a target layer damage other layers. For example, the wires are corroded by process gas applied to pattern the semiconductor layers or the insulating layers.

BRIEF SUMMARY OF THE INVENTION

An exemplary embodiment of the present invention provides a thin film transistor having reduced corrosion during fabrication thereof.

An alternative exemplary embodiment of the present invention provides a method of fabricating the thin film transistor.

Yet another alternative exemplary embodiment of the present invention provides a display apparatus having the thin film transistor.

In an exemplary embodiment of the present invention, a thin film transistor includes a substrate, a gate electrode formed on the substrate, a semiconductor layer formed on the gate electrode, a source electrode formed on the semiconductor layer, and a drain electrode formed on the semiconductor layer and spaced apart from the source electrode. The source electrode and the drain electrode each comprise a copper layer pattern and a copper fluoride layer pattern formed on a surface of the copper layer pattern.

In an alternative exemplary embodiment of the present invention, a method of fabricating a thin film transistor is provided as follows. A gate electrode is formed on a substrate. A semiconductor layer is formed on the gate electrode. A source electrode and a drain electrode that are spaced apart from each other are formed on the semiconductor layer. Each of the source and drain electrodes includes a copper layer pattern and a copper fluoride layer pattern formed on the copper layer pattern.

In yet another alternative exemplary embodiment of the present invention, a display apparatus includes a first substrate and a second substrate. The first substrate includes a pixel area, a gate line formed on the first substrate, a data line formed on the first substrate and being insulated from and intersecting with the gate line, a gate electrode which extends from the gate line, a semiconductor layer formed on the gate electrode, a source electrode formed on the semiconductor layer and which extends from the data line, a drain electrode formed on the semiconductor layer and spaced apart from the source electrode, and a pixel electrode formed in the pixel area and electrically connected to the drain electrode. The second substrate includes a common electrode formed on the second substrate and substantially facing the pixel electrode. The data line, the source electrode and the drain electrode include a copper layer pattern and a copper fluoride layer pattern formed on the copper layer pattern.

According to exemplary embodiment of the present invention, corrosion of electrodes and wires is effectively prevented in the thin film transistor and the display apparatus having the same.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
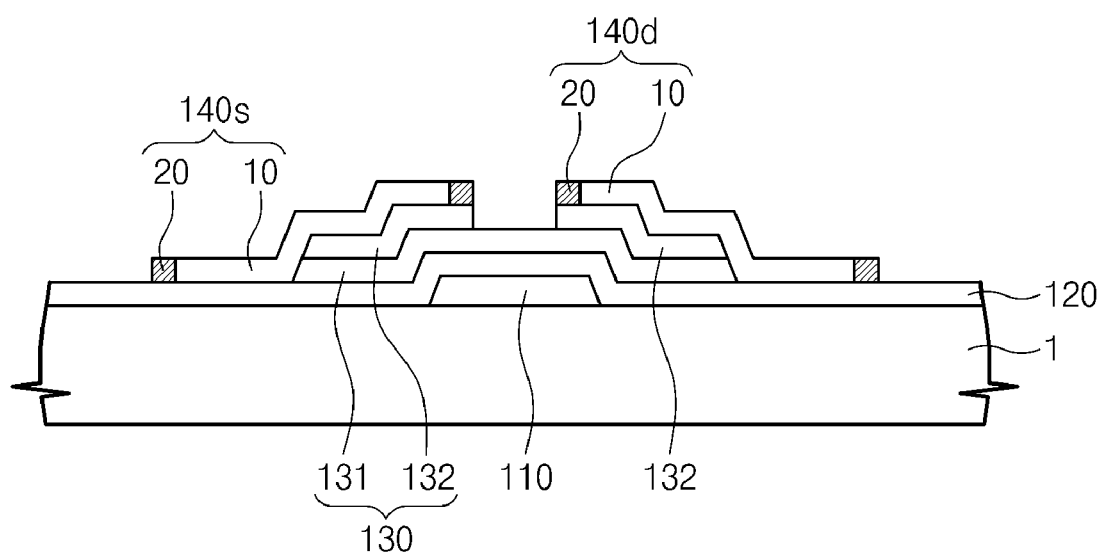
FIG. 1 is a partial cross-sectional view of a thin film transistor according to an exemplary embodiment of the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, the present invention will be explained in further detail with reference to the accompanying drawings.

FIG. 1 is a partial cross-sectional view of a thin film transistor according to an exemplary embodiment of the present invention.

Referring to FIG. 1, a thin film transistor includes a gate electrode 110, a source electrode 140s, and a drain electrode 140d (hereinafter, the source electrode 140s and the drain electrode 140d will be collectively referred to as a "data electrode"). The gate electrode 110 is formed on a substrate 1. A gate insulating layer 120 is formed on the gate electrode 110. A semiconductor layer pattern 130 is formed on the gate insulating layer 120. In an exemplary embodiment, the semiconductor layer pattern 130 includes a two-layered structure including an active pattern 131 and an ohmic contact pattern 132 formed on the active pattern 131. The active pattern 131 includes an intrinsic semiconductor layer in which a channel is formed when the thin film transistor is operated. The ohmic contact pattern 132 is separated into two portions, and the source electrode 140s and the drain electrode 140d are formed to cover the separated two portions of the ohmic contact pattern 132, as shown in FIG. 1.

The source electrode 140s and the drain electrode 140d include a copper layer pattern 10 and a copper fluoride layer pattern 20. The copper fluoride layer pattern 20 is formed substantially adjacent to opposite ends of the copper layer pattern 10. Copper has a low resistivity and a high conductivity, and the copper is thereby highly adaptable as an electrode, for example, of the thin film transistor or, alternatively, as a wire of a display apparatus in which the thin film transistor is utilized. However, the copper layer pattern 10 is easily corroded by reactions with chlorine gas, for example. The copper fluoride layer pattern 20 according to an exemplary embodiment of the present invention, however, effectively prevents the corrosion of the copper layer pattern 10. Specifically, the copper fluoride prevents a reaction between chlorine and copper in the copper layer pattern 10, and the copper fluoride layer pattern 20 therefore serves as a corrosion prevention layer for the copper layer pattern 10.

More specifically, according to an exemplary embodiment, the copper fluoride layer pattern 20 prevents corrosion of the copper layer pattern 10 by the chlorine gas used to pattern the semiconductor layer pattern 130 during a fabricating process of the thin film transistor, as will now be described in further detail with reference to FIGS. 2A to 2F. FIGS. 2A to 2F are partial cross-sectional views illustrating a fabricating method of the thin film transistor of FIG. 1 according to an exemplary embodiment of the present invention.

Figure 2A:
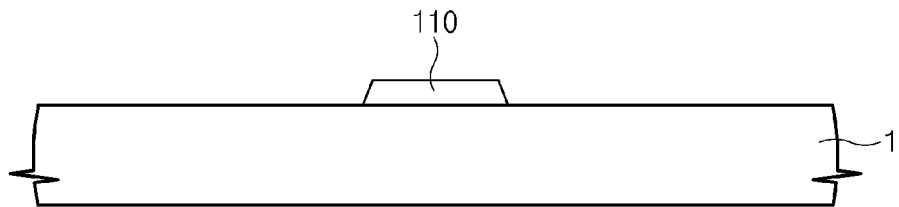
FIGS. 2A to 2F are partial cross-sectional views illustrating a method of fabricating the thin film transistor of FIG. 1 according to an exemplary embodiment of the present invention.

Referring to FIG. 2A, a gate conductive layer (not fully shown) is formed on the substrate 1. In an exemplary embodiment, the substrate 1 is a transparent insulating substrate such as glass or plastic, for example. The gate conductive layer may be formed by a sputtering deposition method, such as may be applied to metals such as an aluminum-containing metal such as aluminum (Al) or an aluminum alloy, a silver-containing metal such as silver (Ag) or a silver alloy, a copper-containing metal such as copper (Cu) or a copper alloy, a molybdenum-containing metal such as molybdenum (Mo) or a molybdenum alloy, chromium (Cr), tantalum (Ta), and titanium (Ti), for example, but not being limited thereto. In an alternative exemplary embodiment, the gate conductive layer may be formed in a multi-layered structure (not shown) having different combinations of the above-mentioned metals.

The gate conductive layer is patterned to form the gate electrode 110. To pattern the gate conductive layer to form the gate electrode 110, a photoresist layer pattern (not shown) is formed on the gate conductive layer, and the gate conductive layer is then etched using the photoresist layer pattern as an etching mask.

Figure 2B:
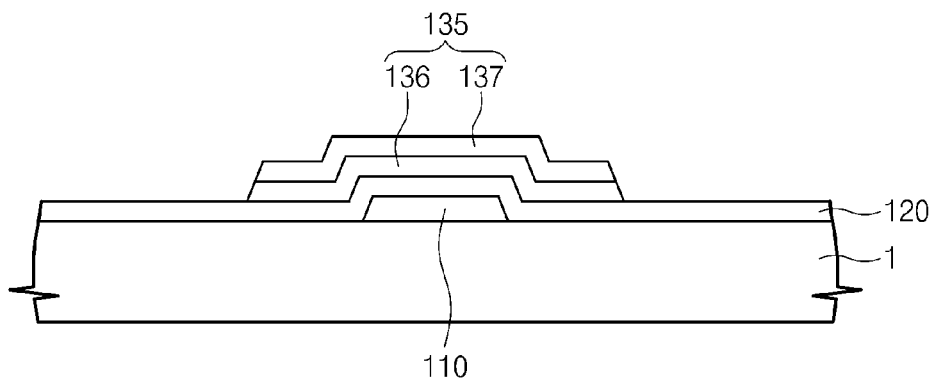

Referring to FIG. 2B, the gate insulating layer 120 and a semiconductor layer (not fully shown) are formed on the gate electrode 110. More specifically, the gate insulating layer 120 is formed on the substrate 1 by a plasma chemical vapor deposition method using silicon nitride, for example, but alternative exemplary embodiments are not limited thereto.

The semiconductor layer is then patterned to form a preliminary semiconductor layer pattern 135. The preliminary semiconductor layer pattern 135 includes a two-layered structure including a preliminary active layer pattern 136 and a preliminary ohmic contact layer pattern 137 formed on the preliminary active layer pattern 136. The preliminary active layer pattern 136 is an intrinsic semiconductor in which no impurities are diffused, while the preliminary ohmic contact layer pattern 137 includes impurities. When patterning the semiconductor layer, a photoresist layer pattern (not shown) is formed on the semiconductor layer and the semiconductor layer is etched using the photoresist layer pattern as an etching mask.

Figure 2C:
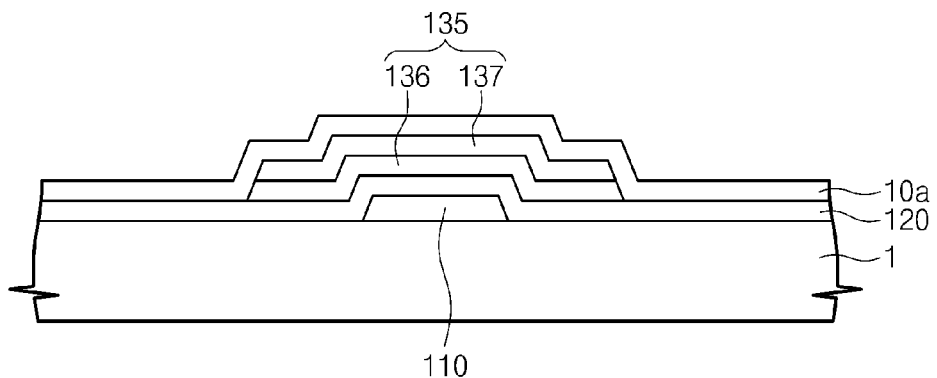

Referring now to FIG. 2C, a copper layer 10a is formed on the preliminary semiconductor layer pattern 135 to form the data electrode. As described above in greater detail with respect to the gate conductive layer, conductive layers may be further formed in addition to the copper layer 10a. For example, a molybdenum (Mo)/niobium (Nb) conductive layer may be interposed between the copper layer 10a and the preliminary semiconductor layer pattern 135, e.g., in an alternative exemplary embodiment wherein the data electrode is formed to include a double-layered structure of the copper and the molybdenum (Mo)/niobium (Nb).

Figure 2D:
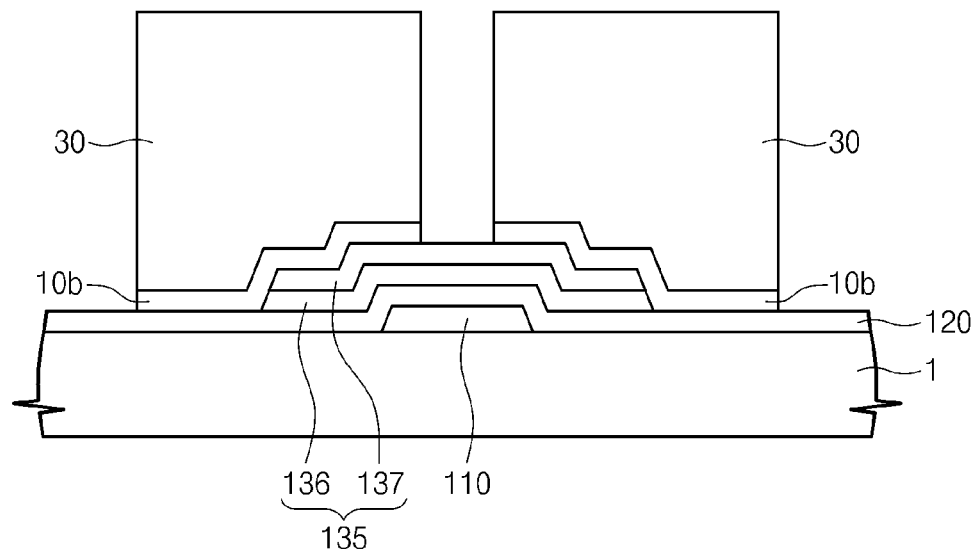

Referring to FIG. 2D, a photoresist layer (not fully shown) is formed on the copper layer 10a. The photoresist layer is exposed to a light not shown) and thereby develops to form a photoresist layer pattern 30. The photoresist layer pattern 30 exposes a portion of the copper layer 10a (FIG. 2C) which covers a center portion of the gate electrode 110. The exposed copper layer 10a is then etched using the photoresist layer pattern 30 as an etching mask to form a preliminary copper layer pattern 10b. As shown in FIG. 2D, the preliminary copper layer pattern 10b is formed into two portions, e.g., separate portions, disposed substantially on opposite sides of the gate electrode 110.

Figure 2E:
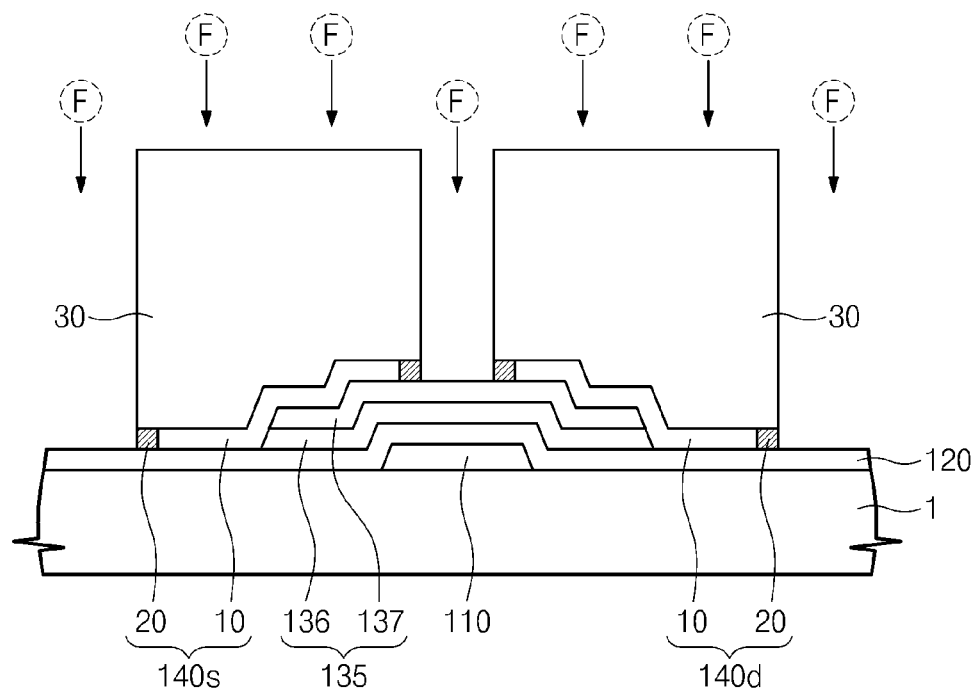

Referring to FIG. 2E, the above-mentioned components are exposed to a fluorine (F)-containing process gas, and the fluorine (F) reacts with copper in opposite ends of the preliminary copper layer pattern 10b. A region substantially between the opposite ends of the preliminary copper layer pattern 10b, e.g., a region in which the fluorine does not react with the copper, becomes the copper layer pattern 10, while a region in which the fluorine does react with the copper becomes the copper fluoride layer pattern 20. Further, the source electrode 140s and the drain electrode 140d each including the copper layer pattern 10 and the copper fluoride layer pattern 20 are formed, as shown in FIG. 2E.

Still referring to FIG. 2E, the copper fluoride layer pattern 20, the copper therein having been exposed to the fluorine-containing process gas, now includes cuprous fluoride ("CuF") or cupric fluoride ("CuF$_2$"). However, the cupric fluoride ("CuF$_2$") has substantially better thermodynamic stability than a thermodynamic stability of the cuprous fluoride ("CuF"), and the cupric fluoride ("CuF$_2$") is therefore formed to be a principle component of the copper fluoride layer pattern 20 according to an exemplary embodiment of the present invention.

In an exemplary embodiment, the fluorine-containing process gas is sulfur hexafluoride ("SF$_6$"), for example, but alternative exemplary embodiments are not limited thereto. For example, the fluorine-containing process gas may be a mixed gas of sulfur hexafluoride ("SF$_6$") and oxygen ("O$_2$"), carbon tetrafluoride ("CF$_4$"), or a mixed gas of carbon tetrafluoride ("CF$_4$") and oxygen ("O$_2$"). In addition, the gas may be provided in a plasma state, and the gas may thereby etch a portion of the preliminary semiconductor layer pattern 135 exposed through the photoresist layer pattern 30 (see FIG. 2E). However, the fluorine-containing process gas has substantially no etch selectivity between the preliminary semiconductor layer pattern 135 (including, e.g., silicon) and the gate insulating layer 120 (including, e.g., silicon nitride). Thus, when the fluorine-containing process gas is provided, the gate insulating layer 120 may be damaged, particularly when the fluorine-containing process gas is provided for an extended period of time. Accordingly, in an exemplary embodiment, the fluorine-containing process gas is provided for an adequate period of time during which the copper fluoride layer pattern 20 is formed without damaging the gate insulating layer 120.

When the fluorine-containing process gas is the mixed gas of sulfur hexafluoride ("SF$_6$") and oxygen ("O$_2$") and/or the mixed gas of carbon tetrafluoride ("CF$_4$") and oxygen ("O$_2$"), the oxygen ("O$_2$") generates more fluorine in a plasma state. Thus, in an exemplary embodiment, a mixing ratio of the sulfur hexafluoride ("SF$_6$") to the oxygen ("O$_2$") of the mixed gas of sulfur hexafluoride ("SF$_6$") and oxygen ("O$_2$") is in a range of approximately 0.1:1 to approximately 1:1. Also, a mixing ratio of the carbon tetrafluoride ("CF$_4$") to the oxygen ("O$_2$") in the mixed gas of carbon tetrafluoride ("CF$_4$") and oxygen ("O$_2$") is in a range of approximately 0.1:1 to approximately 1:1.

Figure 2F:
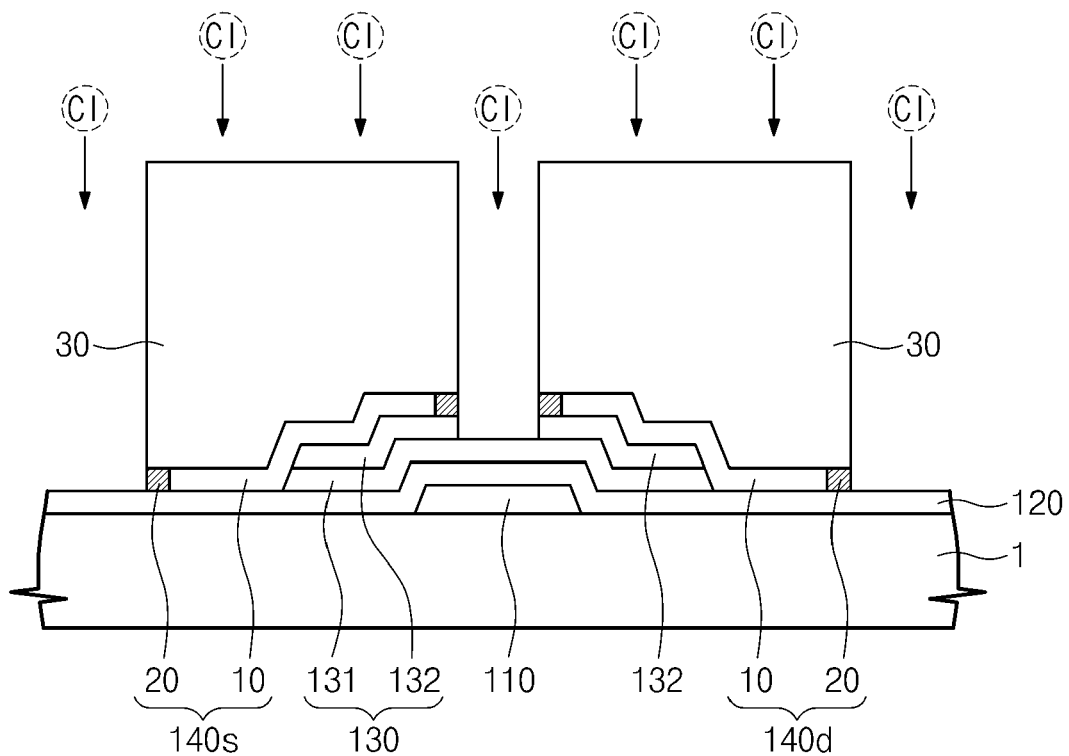

Referring now to FIG. 2F, the semiconductor layer pattern 135 is exposed to a chlorine-containing process gas ("Cl$_2$" and "HCl"), and the preliminary semiconductor layer pattern 135 is thereby dry-etched by the chlorine-containing process gas to form the semiconductor layer pattern 130. In an exemplary embodiment, the semiconductor layer pattern 130 includes a two-layered structure including the active layer pattern 131 and the ohmic contact layer pattern 132 formed on the active layer pattern 131, as shown in FIG. 2F. Thus, the ohmic contact layer pattern 132 is formed by dry etching the preliminary ohmic contact layer pattern 137 (FIG. 2E). Further, the ohmic contact layer pattern 132 is separated into two portions each corresponding to one of the source electrode 140s and the drain electrode 140d. In an exemplary embodiment, only a small upper portion of the preliminary active layer pattern 136 is etched when the preliminary semiconductor layer pattern 135 is dry-etched. Thus, the active layer pattern 131 has a substantially same thickness as a thickness of the preliminary active layer pattern 136.

Chlorine (Cl) in the chlorine-containing process gas has an etch selectivity between the preliminary semiconductor layer pattern 135 (including the silicon) and the gate insulating layer 120 (including the silicon nitride). Accordingly, an exposed portion of the gate insulating layer 120 is not etched when the preliminary semiconductor layer pattern 135 is etched. Chlorine (Cl) tends to corrode copper; however, in an exemplary embodiment, the copper layer pattern 10 formed on the source electrode 140s and the drain electrode 140d is protected from the chlorine (Cl) by the copper fluoride layer pattern 20, and is therefore not corroded by the chlorine (Cl).

The photoresist layer pattern 30 is then removed, and the thin film transistor is thereafter substantially completely formed. The preliminary semiconductor layer pattern 135 may then be etched using the source electrode 140s and the drain electrode 140d as an etching mask after the photoresist layer pattern 30 is removed. In this case, the chlorine (Cl) may react with surfaces of the source electrode 140s and the drain electrode 140d and thereby partially corrode the surfaces of the source electrode 140s and the drain electrode 140d. Therefore, in an exemplary embodiment wherein the source electrode 140s and the drain electrode 140d are used as the etching mask, the copper fluoride is formed on surfaces of the source electrode 140s and the drain electrode 140d. For example, the copper fluoride may be formed on the surfaces of the source electrode 140s and the drain electrode 140d by removing the photoresist layer pattern 30 prior to the dry-etching process described above in greater detail with reference to in FIG. 2E.

Figure 3:
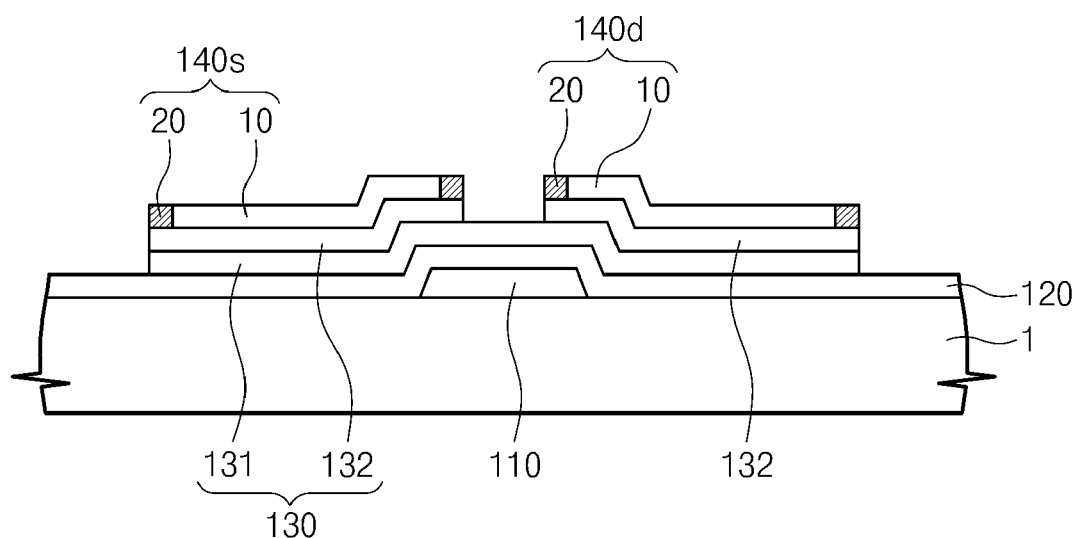
FIG. 3 is a partial cross-sectional view of a thin film transistor according to an alternative exemplary embodiment of the present invention.

FIG. 3 is a partial cross-sectional view of a thin film transistor according to an alternative exemplary embodiment of the present invention. In FIG. 3, the same reference numerals denote the same or like elements as in FIG. 1, and thus any repetitive description thereof will be omitted.

Referring to FIG. 3, a thin film transistor according to an alternative exemplary embodiment of the present invention includes a substrate 1, and a gate electrode 110 and a data electrode formed thereon. A gate insulating layer 120 and a semiconductor layer pattern 130 are sequentially formed on the substrate 1. The data electrode includes a source electrode 140s and a drain electrode 140d. The semiconductor layer pattern 130 includes an active pattern 131 and an ohmic contact pattern 132. In a plan view (not shown) at least a portion of the ohmic contact pattern 132 overlaps at least a portion of the data electrode. Further, at least a portion of the active pattern 131 overlaps a portion of the data electrode, e.g., a portion except a region where a channel region of the thin film transistor is formed.

The source electrode 140s and the drain electrode 140d include a copper layer pattern 10 and a copper fluoride layer pattern 20. The copper fluoride layer pattern 20 prevents a corrosion of the copper layer pattern 10 during a method of manufacturing the thin film transistor according to an exemplary embodiment.

FIGS. 4A to 4G are partial cross-sectional views illustrating a method of fabricating the thin film transistor of FIG. 3 according to an alternative exemplary embodiment of the present invention.

Figure 4A:
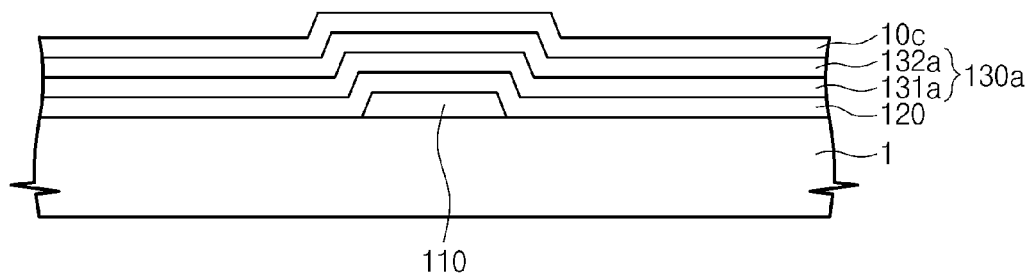
FIGS. 4A to 4G are partial cross-sectional views illustrating a method of fabricating the thin film transistor of FIG. 3 according to an alternative exemplary embodiment of the present invention.

Referring to FIG. 4A, a gate conductive layer (not fully shown) is formed on the substrate 1, and the gate conductive layer is patterned to form the gate electrode 110 on the substrate 1. The gate insulating layer 120 is formed on the substrate 1 to substantially cover the gate electrode 110, and a semiconductor layer 130a is formed on the gate insulating layer 120. In an exemplary embodiment, the semiconductor layer 130a includes a two-layered structure including an active layer 131a having an intrinsic semiconductor and an ohmic contact layer 132a having a semiconductor into which impurities are doped. A copper layer 10c is formed on the semiconductor layer 130a to form the data electrode. A conductive layer including, for example, molybdenum (Mo)/Niobium (Nb) may be interposed between the copper layer 10c and the semiconductor layer 130a. As a result, the data electrode includes a two-layered structure of different metals, e.g., copper and the molybdenum (Mo)/Niobium (Nb), but alternative exemplary embodiments are not limited thereto.

Figure 4B:
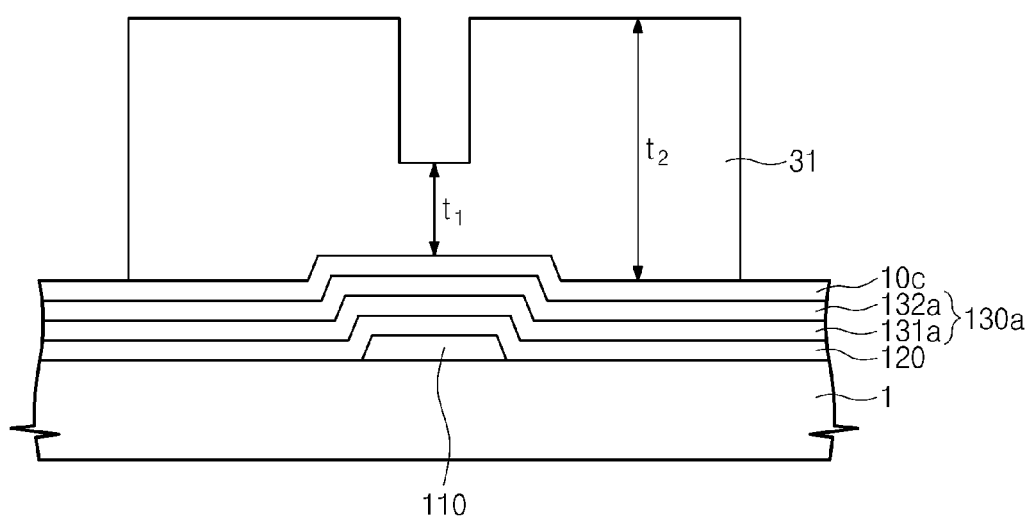

Referring to FIG. 4B, a photoresist layer (not fully shown) is formed on the copper layer 10c. The photoresist layer is exposed to a light (not shown) and is thereby developed to form a first photoresist layer pattern 31. As shown in FIG. 4B, the first photoresist layer pattern 31 has an unevenness thickness, e.g., a thickness of the first photoresist layer pattern 31 varies according to regions of the first photoresist layer pattern 31. Specifically, the first photoresist layer pattern 31 has a first thickness t1 in a predetermined region proximate to the gate electrode 110 and has a second thickness t2 in substantially adjacent regions of the gate electrode 110. In an exemplary embodiment, the first photoresist layer pattern 31 having different thicknesses is formed by exposing the photoresist layer pattern 31 to a light using a slit mask (not shown) or a halftone mask (not shown). More specifically, the slit mask or the halftone mask has a transmission region, a non-transmission region, and a semi-transmission region. Further, the slit mask has a plurality of slits formed in the semi-transmission region and thereby controls an amount of the light transmitted through the slit mask based on a distance between slits of the plurality of slits. In addition, the semi-transmission region includes a material which partially transmits the light, and the amount of light partially transmitted is controlled by a type and/or an amount of the material included in the semi-transmission region.

In an exemplary embodiment, the photoresist layer is a positive type photoresist layer, wherein the first photoresist layer pattern 31 has the first thickness t1 in an area corresponding to the semi-transmission region and the second thickness t2 in an area corresponding to the non-transmission region. Therefore, the photoresist layer is removed in an area corresponding to the transmission region, and the copper layer 10c corresponding to the removed photoresist layer is thereby exposed.

Figure 4C:
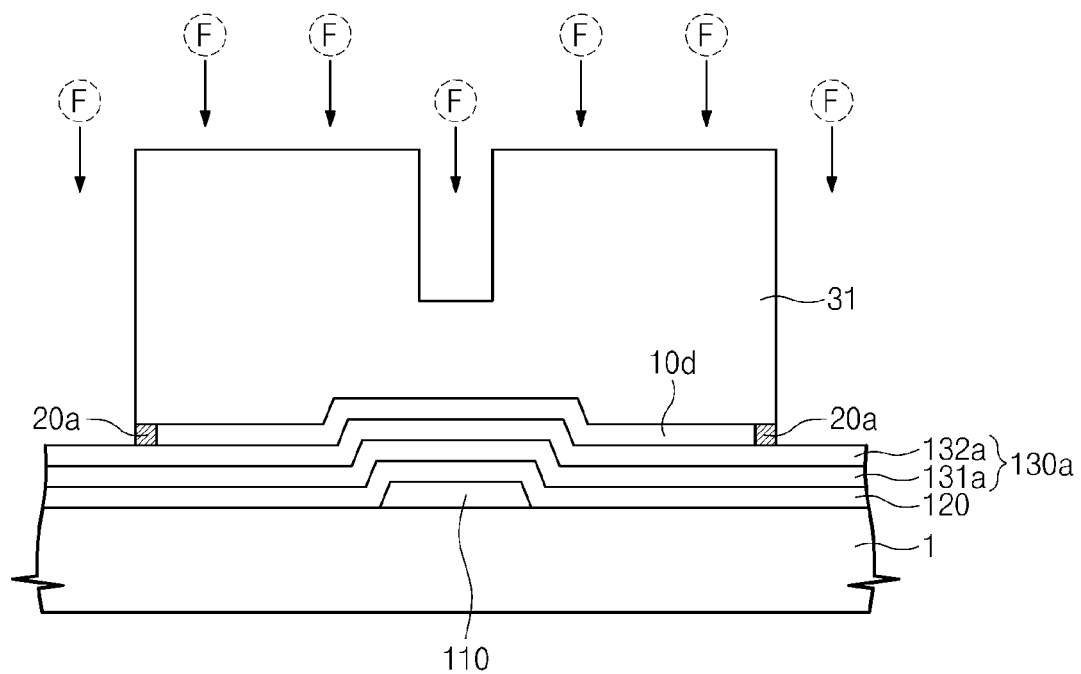

Referring to FIG. 4C, a first copper layer pattern 10d is formed by etching the copper layer 10c using the first photoresist layer pattern 31 as an etching mask. Then, the first copper layer pattern 10d is exposed to a fluorine-containing process gas. Fluorine (F) in the fluorine-containing process gas reacts with copper in opposite ends of the first copper layer pattern 10d, thereby forming a first copper fluoride layer pattern 20a at both ends of the first copper layer pattern 10d, as shown in FIG. 4C.

The fluorine-containing process gas may be sulfur hexafluoride ("$SF_6$"), a mixed gas of sulfur hexafluoride ("$SF_6$") and oxygen ("$O_2$"), carbon tetrafluoride ("$CF_4$"), or a mixed gas of carbon tetrafluoride ("$CF_4$") and oxygen ("$O_2$"). The fluorine-containing process gas may be provided in a plasma state, and the semiconductor layer 130a exposed by the first photoresist layer pattern 31 may be partially etched by the fluorine-containing process gas.

Figure 4D:
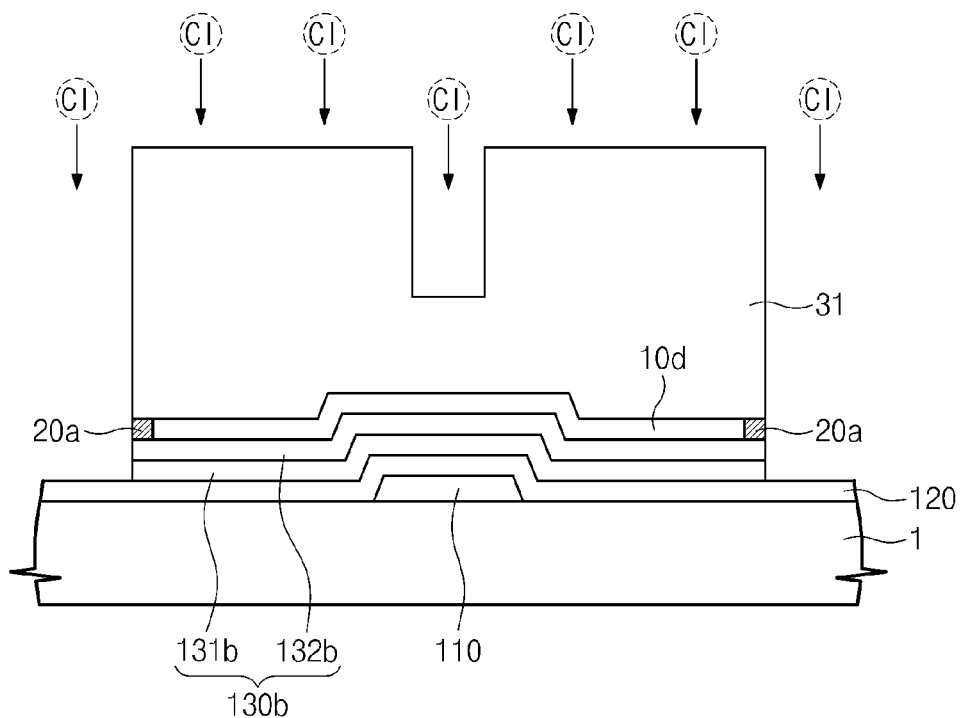

Referring now to FIG. 4D, a chlorine-containing process gas ("$Cl_2$" and "HCl") is provided, and the semiconductor layer 130a is etched by the chlorine-containing process gas to form a preliminary semiconductor layer pattern 130b. In an exemplary embodiment, the preliminary semiconductor layer pattern 130b includes a two-layered structure including a preliminary active layer pattern 131b and a preliminary ohmic contact layer pattern 132b.

The first photoresist layer pattern 31 serves as an etching mask for the copper layer 10c and the semiconductor layer 130a. Thus, the first copper layer pattern 10d overlaps the preliminary semiconductor layer pattern 130b. As a result, the first copper fluoride layer pattern 20a effectively prevents the copper from being corroded by chlorine (Cl) in the chlorine-containing process gas during the above-mentioned process.

Figure 4E:
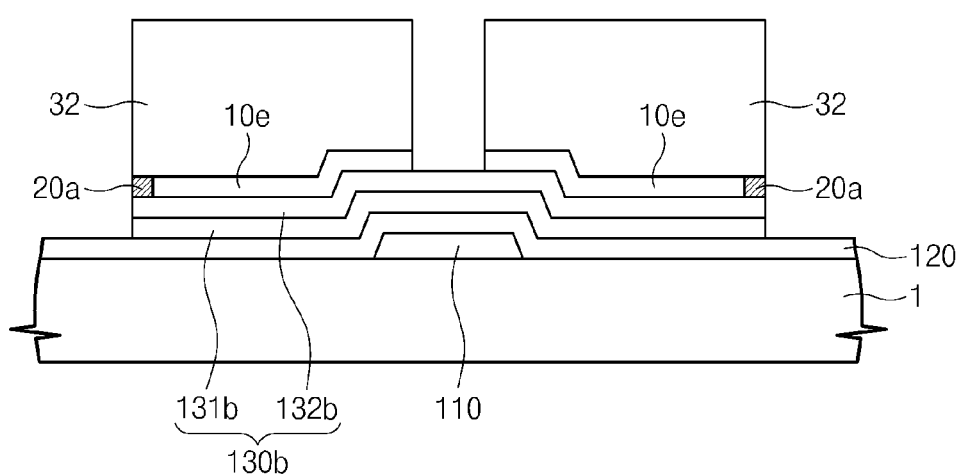

Referring to FIG. 4E, a center portion of the first photoresist layer pattern 31 proximate to the first thickness t1, e.g., disposed substantially above the gate electrode 100, is removed to form a second photoresist layer pattern 32. The second photoresist layer pattern 32 has a thickness corresponding to a difference between the first thickness t1 and the second thickness t2. Accordingly, an upper portion of the first copper layer pattern 10d corresponding to the first photoresist layer pattern 31 having the first thickness t1 is exposed through the second photoresist layer pattern 32 (not shown).

The first copper layer pattern 10d is then etched using the second photoresist layer pattern 32 as an etching mask. As a result, a second copper layer pattern 10e having two parts is formed. In addition, copper in the second copper layer pattern 10e is exposed on corresponding ends of each part of the second copper layer pattern 10e substantially above the gate electrode 110.

Figure 4F:
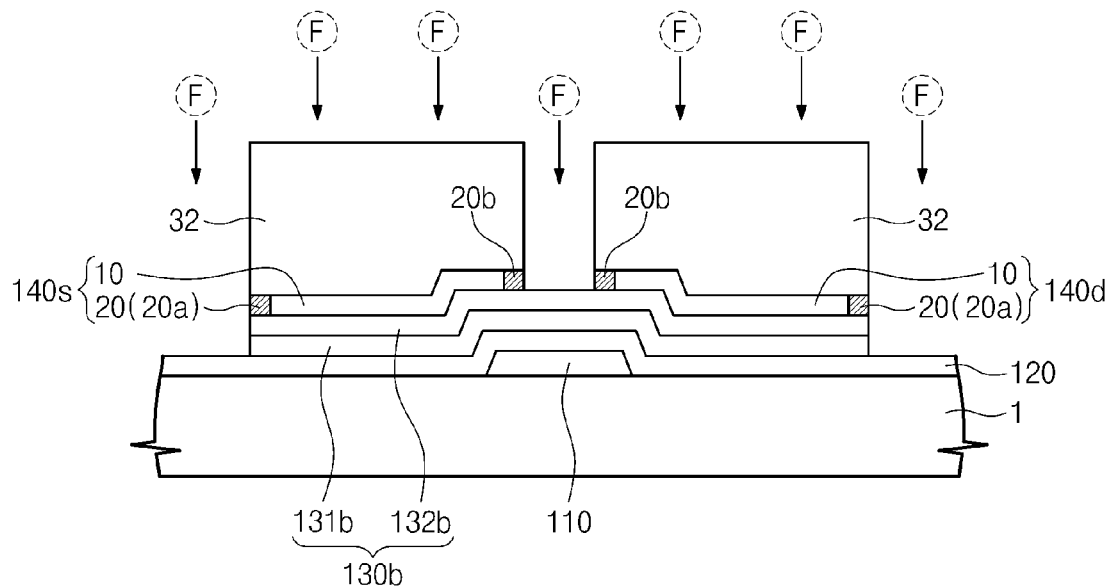

Referring to FIG. 4F, a fluorine-containing process gas is again provided. As a result, the exposed copper of the second copper layer pattern 10e reacts with fluorine (F) in the fluorine-containing process gas to form a second copper fluoride layer pattern 20b at respective ends of the second copper layer pattern 10e adjacent to the separated region, e.g., substantially above the gate electrode 110, by the reaction between the copper and the fluorine (F), thereby forming the source electrode 140s and the drain electrode 140d.

Thus, the source electrode 140s and the drain electrode 140d include the copper layer pattern 10 and the copper fluoride layer pattern 20. Specifically, as described above, the copper layer pattern 10 is formed from the second copper layer pattern 10e, while the copper fluoride layer pattern 20 includes the first copper fluoride layer pattern 20a formed in a previous process and the second copper fluoride layer pattern 20b formed in a subsequent process, described below.

Figure 4G:
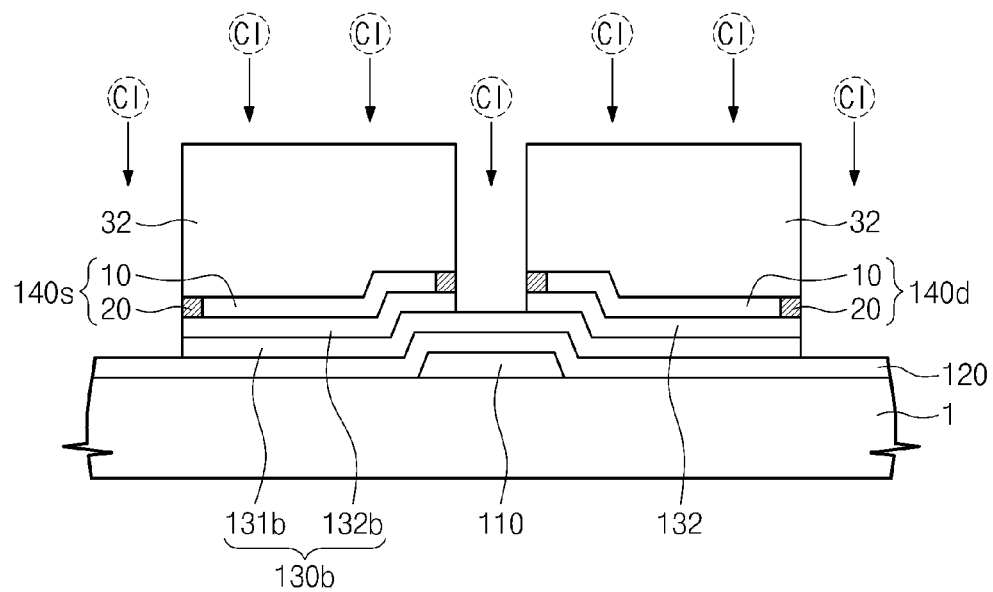

Referring to FIG. 4G, a chlorine-containing process gas ("Cl$_2$" and "HCl") is again provided, and the preliminary semiconductor layer pattern 130b is thereby etched by the chlorine-containing process gas to form the semiconductor layer pattern 130. In an exemplary embodiment, the semiconductor layer pattern 130 includes a two-layered structure including the active layer pattern 131 and the ohmic contact layer pattern 132.

The ohmic contact layer pattern 132 is formed by dry-etching the preliminary ohmic contact layer pattern 132b. In addition, the ohmic contact layer pattern 132 is formed to have into two separate portions along each of the source electrode 140s and the drain electrode 140d. Then, the preliminary active layer pattern 131b is partially etched, e.g., etched only on a top surface thereof. Thus, the active layer pattern 131 has a thickness substantially equal to a thickness of the preliminary active layer pattern 131b.

According to a method of manufacturing the thin film transistor according to the exemplary embodiment described above, the semiconductor layer pattern 130, the source electrode 140s, and the drain electrode 140d are formed using a same photo-mask, and, as a result, a total number of photo-masks in use and the number of light exposing processes are thereby substantially decreased.

In addition, according to the method described above, the semiconductor layer pattern 130, the source electrode 140s, and the drain electrode 140d are formed using the same photo-mask, and the total number of the photo-masks and the number of time of the exposure processes may thereby be further reduced.

However, the copper layer 10c is therefore etched before the semiconductor layer 130a is etched. Thus, as shown in FIG. 4D, when a first etching for the semiconductor layer 130a is being performed, sides of the first copper layer pattern 10d formed by etching the copper layer 10c are exposed. Since a chlorine gas is used to etch the semiconductor layer 130a, the first copper layer pattern 10d is therefore easily corroded. However, corrosion of the first copper layer pattern 10d is effectively prevented by the first copper fluoride layer pattern 20a. In addition, as shown in FIG. 4G, only a small area, e.g., an area corresponding to the channel area of the already-etched preliminary semiconductor layer pattern 130b, is etched.

In an exemplary embodiment, the thin film transistor is implemented in each pixel area of a plurality of pixel areas of a display apparatus, such as a liquid crystal display, although alternative exemplary embodiments are not limited thereto.

Figure 5:
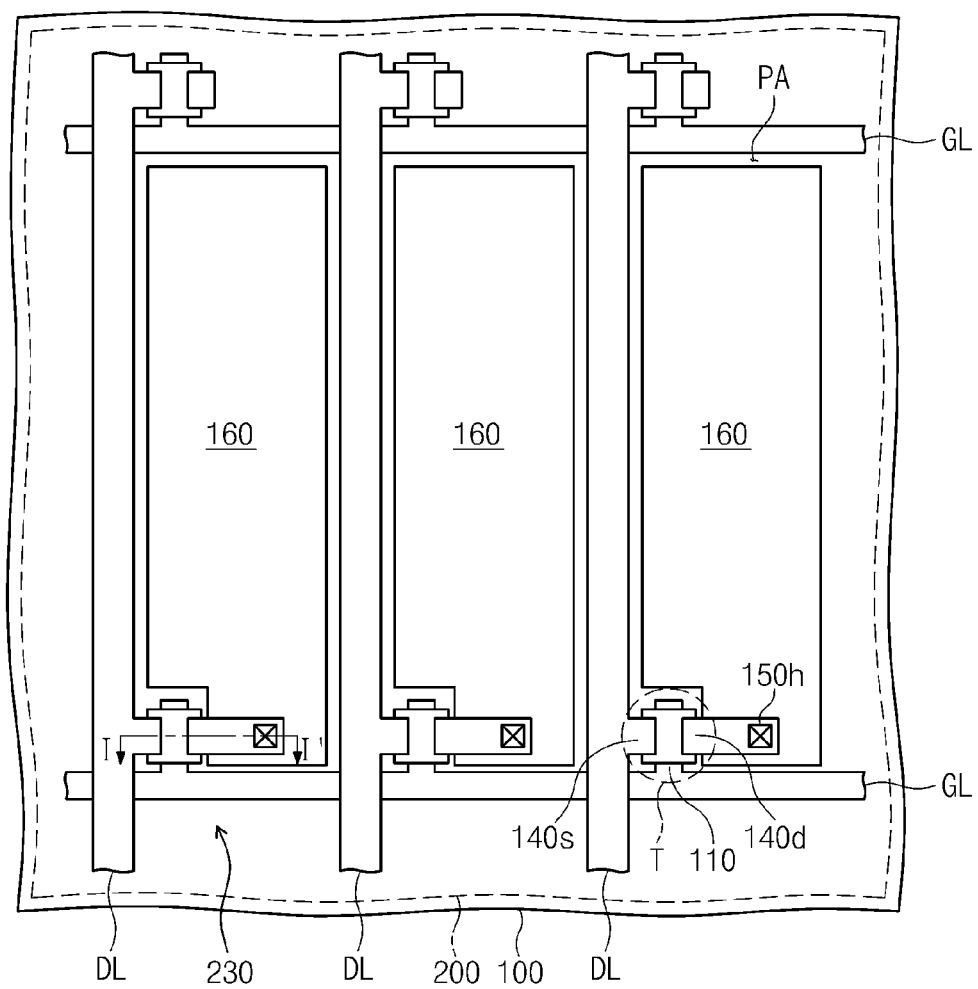
FIG. 5 is a plan view of a liquid crystal display according to an exemplary embodiment of the present invention.

FIG. 5 is a plan view of a liquid crystal display according to an exemplary embodiment the present invention.

Referring to FIG. 5, a liquid crystal display includes a first substrate 100 and a second substrate 200. A plurality of wires is disposed on the first substrate 100. Wires of the plurality of wires include a gate line GL disposed in a first, substantially horizontal direction, and a data line DL, disposed in a second, substantially vertical direction, opposite to the first direction, as shown in FIG. 5. Each pixel area PA of a plurality of the pixel areas has substantially the same configuration and substantially the same function. In an exemplary embodiment, each pixel area may be defined by a gate line GL and a data line DL, but alternative exemplary embodiments are not limited thereto. In addition, each pixel area PA includes a thin film transistor T and a pixel electrode 160. The thin film transistor T includes a gate electrode 110, a source electrode 140s, and a drain electrode 140d. The gate electrode 110 branches out, e.g., away from, the gate line GL in the second direction. The source electrode 140s is branches out from the data line DL in first direction, e.g., toward the gate electrode 110. The drain electrode 140d is spaced apart from the source electrode 140s and is electrically connected to the pixel electrode 160 through a contact hole 150h.

The thin film transistor T has substantially the same structure as that of the thin film transistor described above with reference to FIGS. 1 to 3 and may be formed through a same manufacturing method as also described above in greater detail.

The second substrate 200 includes a common electrode 230 corresponding to the pixel electrode 160.

Figure 6A:
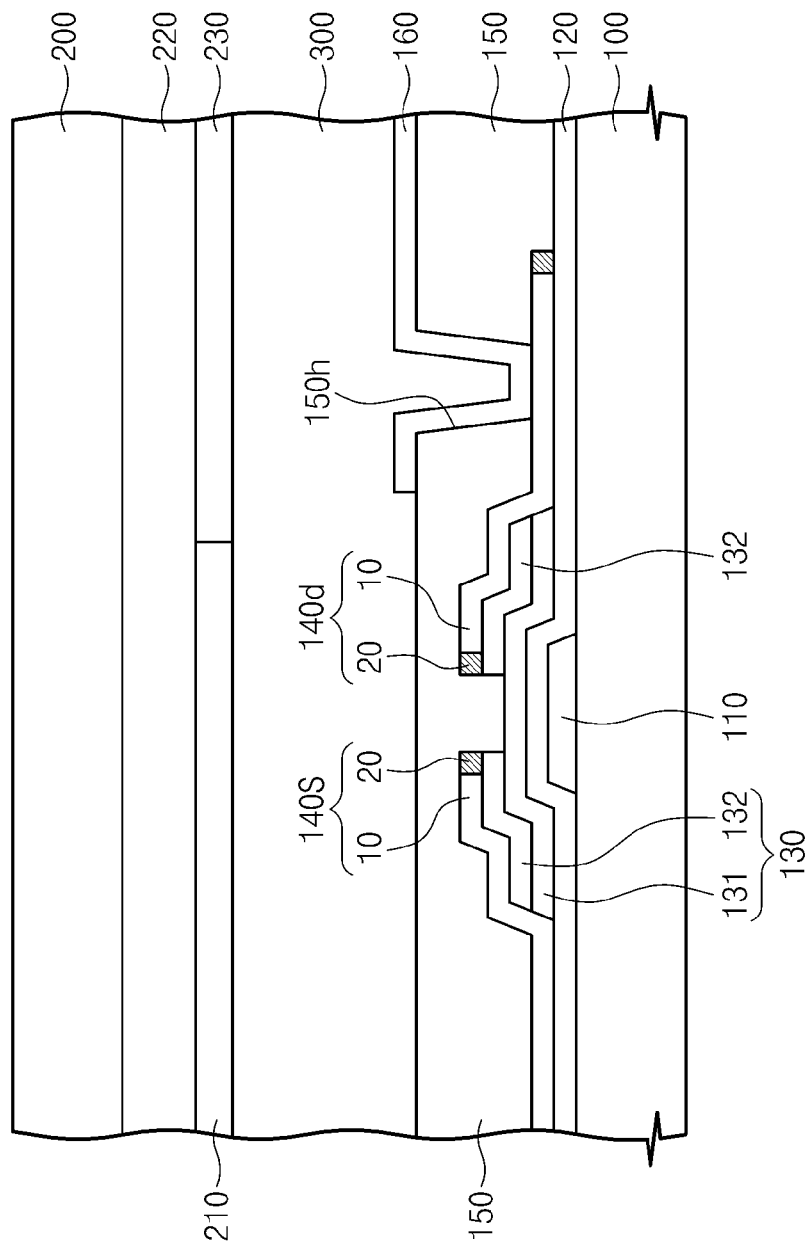
FIGS. 6A and 6B are partial cross-sectional views taken along line I-I' of FIG. 5 showing alternative exemplary embodiments of the present invention.
Figure 6B:
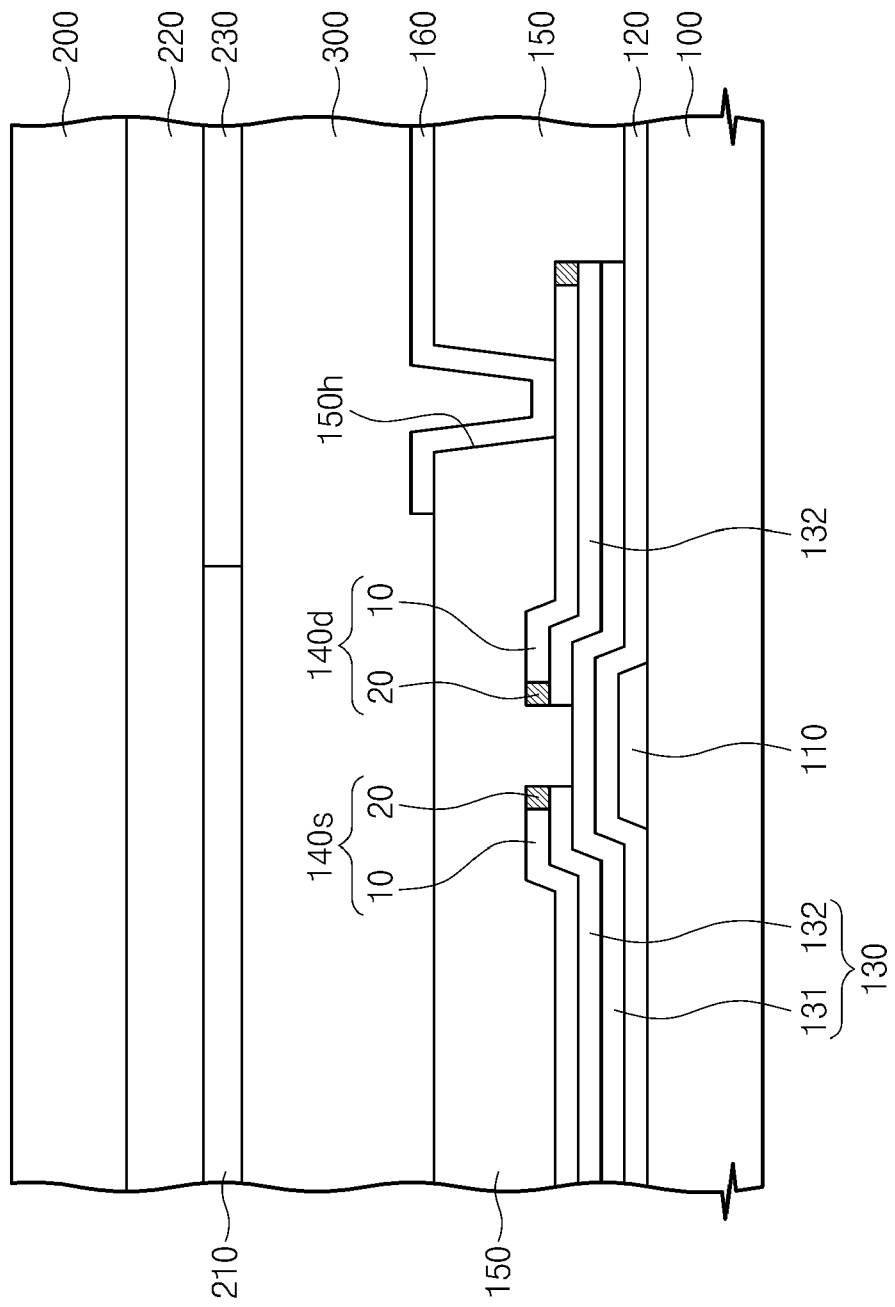

FIGS. 6A and 6B are partial cross-sectional views taken along line I-I' of FIG. 5 showing alternative exemplary embodiments of the present invention.

Referring to FIG. 6A, a gate insulating layer 120 and a semiconductor layer pattern 130 are formed between the gate electrode 110 and the source electrode 140s and the drain electrode 140d on the first substrate 100. The semiconductor layer pattern 130 includes an active layer pattern 131 and an ohmic contact layer pattern 132. As described above in greater detail with reference to FIGS. 2A to 2F, the semiconductor layer pattern 130 is formed by using a photo-mask different from a photo-mask used to form the source electrode

140s and the drain electrode 140d, and the semiconductor layer pattern 130 partially overlaps the source electrode 140s and the drain electrode 140d.

The gate electrode 110 and the gate line GL are formed on a same layer and, in an exemplary embodiment, include a same material. The source electrode 140s, the drain electrode 140d, and the data line DL are formed on a same layer and also include a same material in an exemplary embodiment. More specifically, the source electrode 140s, the drain electrode 140d, and the data line DL includes a copper layer pattern 10 and a copper fluoride layer pattern 20. The copper fluoride layer pattern 20 is formed at opposite ends of the source electrode 140s and the drain electrode 140d to prevent the copper layer pattern 10 from corroding during a fabricating process of the thin film transistor T. In an exemplary embodiment, the data line DL further includes the copper fluoride layer pattern 20 at opposite ends thereof (not shown).

The source electrode 140s and the drain electrode 140d are substantially covered by a protective layer 150. The protective layer 150 is provided with the contact hole 150h through which the drain electrode 140d is exposed. The pixel electrode 160 is formed on the protective layer 150, and the pixel electrode 160 is electrically connected to the drain electrode 140d through the contact hole 150h.

A light blocking layer pattern 210, a color filter 220, and the common electrode 230 are formed on the second substrate 200. The light blocking layer pattern 210 blocks a light from being transmitted through a region between adjacent pixel areas PA. The color filter 220 includes red, green, and blue color filters corresponding to, for example, three primary light colors to display a color image by the combination thereof. The common electrode 230 is disposed opposite to the pixel electrode 160, and a liquid crystal layer 300 is interposed between the pixel electrode 160 and the common electrode 230.

When the liquid crystal display is operated, a gate-on signal is transmitted through the gate line GL to turn on the thin film transistor T, and a data voltage corresponding to image information is thereby applied to the pixel electrode 160 through the data line DL and the turned-on thin film transistor T. A constant common voltage is applied to the common electrode 230, and an electric field is generated in the liquid crystal layer 300 due to a voltage difference between the data voltage and the common voltage. Liquid crystal molecules (not shown) in the liquid crystal layer 300 are arranged based on the electric field applied thereto. According to an alignment state of the liquid crystal molecules, light is emitted to an exterior through the liquid crystal layer 300. Thus, the liquid crystal display controls the alignment state of the liquid crystal molecules using the electric field to display a corresponding image.

When operating the liquid crystal display, each of the data line DL, the source electrode 140s, and the drain electrode 140d includes copper which has a superior conductivity, and electrical signals are thereby rapidly transmitted, thereby substantially improving a response speed of the liquid crystal display according to an exemplary embodiment of the present invention.

Referring now to FIG. 6B, in an alternative exemplary embodiment, the semiconductor layer pattern 130 overlaps the source electrode 140s, the drain electrode 140d, and the data line DL. In addition, in an alternative exemplary embodiment, the thin film transistor T having the above-described structure may be fabricated according to a method thereof as described above in greater detail with reference to FIGS. 4A to 4G.

FIGS. 7A to 7F are plan views showing corrosion test results of a copper layer formed using different process gases.

Figure 7A:
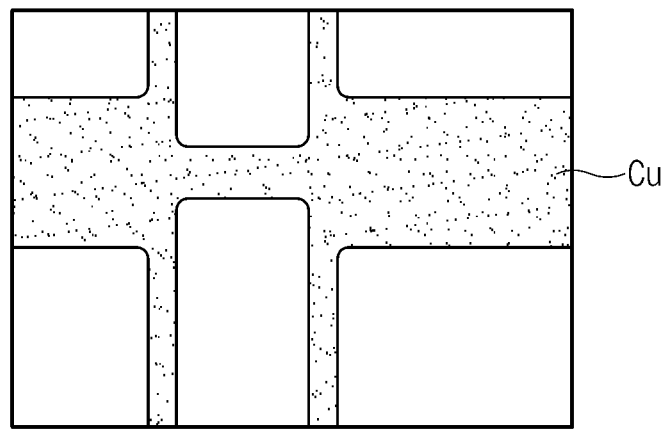
FIGS. 7A to 7F are plan views showing corrosion test results of a copper layer formed using different process gases.

FIG. 7A shows a portion of a copper layer which is exposed to a chlorine-containing process gas. Referring to FIG. 7A, severe corrosion has been observed as dots that occur on a surface of the copper layer.

Figure 7B:
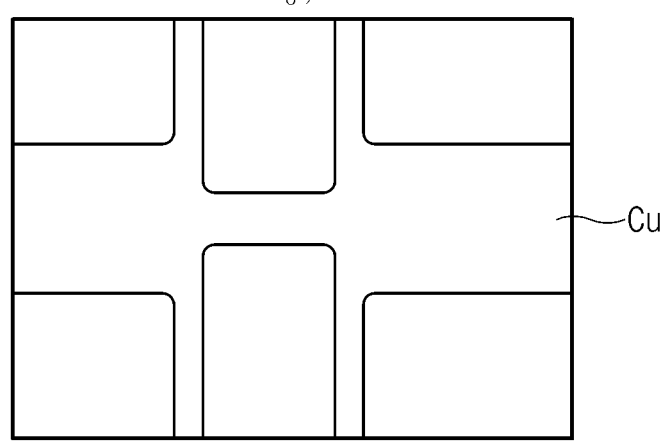
Figure 7C:
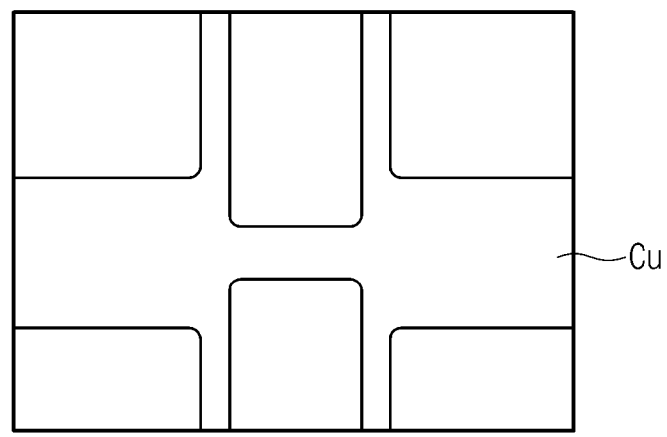
Figure 7D:
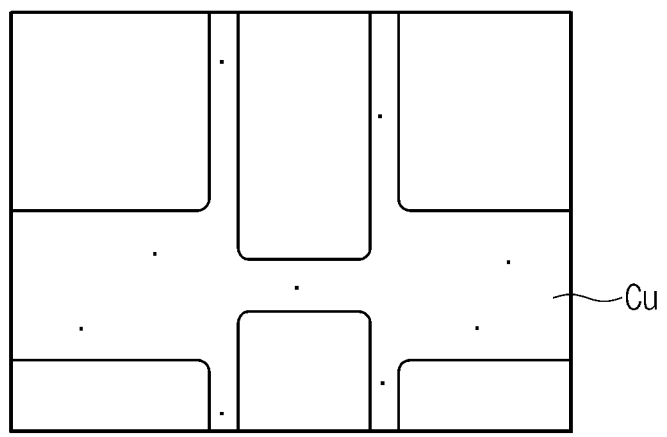
Figure 7E:
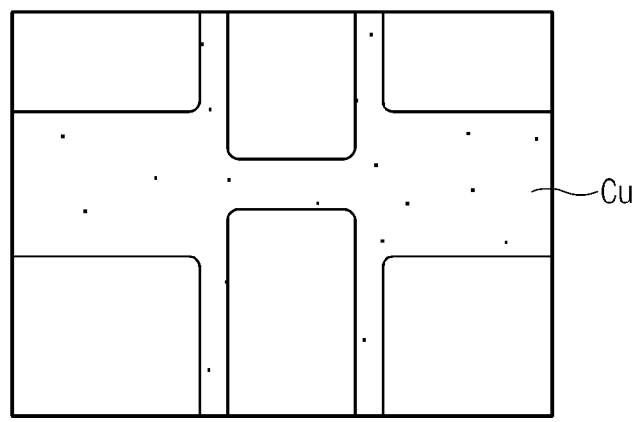
Figure 7F:
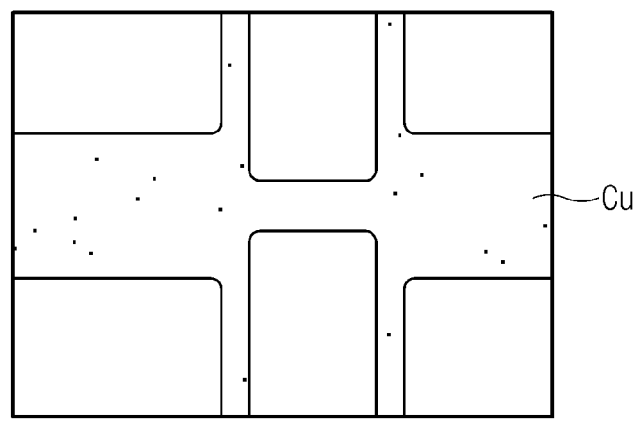

FIGS. 7B to 7F show preprocessing steps in which a chlorine-containing process gas is provided to a copper layer after a corrosion prevention layer is subsequently formed on an exposed surface of the copper layer. Referring to FIGS. 7B to 7F, corrosion of a surface of the copper layer has been substantially reduced and/or effectively prevented as compared to the surface of the copper layer shown in FIG. 7A. Particularly, when sulfur hexafluoride ("$SF_6$") including fluorine (F) is provided to the copper layer to perform a pretreatment for the copper layer, as shown in FIG. 7B, corrosion of the copper layer is effectively completely prevented.

Figure 8:
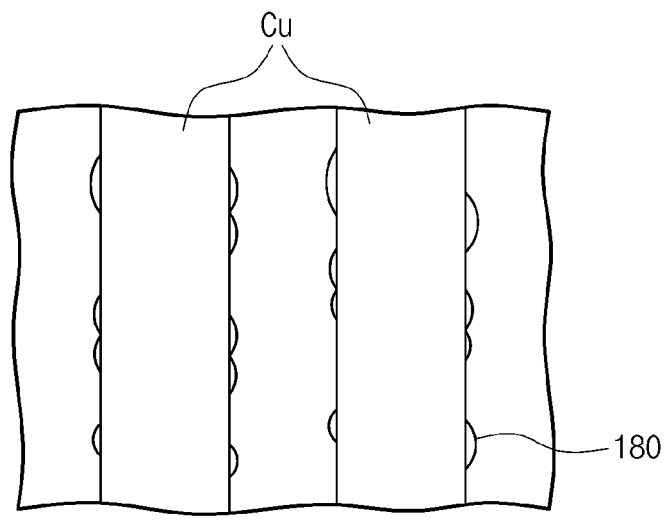
FIG. 8 is a plan view showing corrosion test results of a copper wire formed by a conventional fabricating method.

FIG. 8 is a plan view showing corrosion test results of a copper wire formed by a conventional fabricating method. Specifically, FIG. 8 shows an example wherein a copper wire is etched using a chlorine (Cl) gas in a display apparatus employing the copper wire. Referring to FIG. 8, severe corrosion 180 has occurred on a surface of the copper wire.

Figure 9:
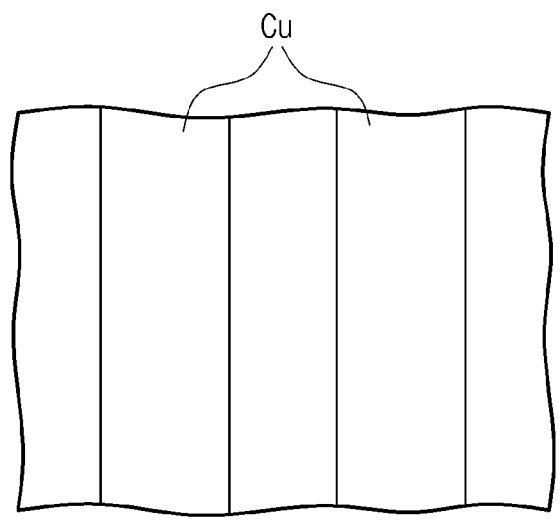
FIG. 9 is a plan view showing corrosion test results of a copper wire formed by a fabricating method according to an exemplary embodiment of the present invention.

FIG. 9 is a plan view showing corrosion test results of a copper wire formed by a fabricating method according to an exemplary embodiment of the present invention.

FIG. 9 shows an example in which a copper wire is etched using chlorine (Cl) gas after copper fluoride is formed in a display including the copper wire. Referring to FIG. 9, it can be seen that, in a method according to an exemplary embodiment of the present invention, corrosion of the copper wire has been substantially reduced and/or effectively prevented.

As described herein, according to an exemplary embodiment of the present invention, corrosion in electrodes and wires of a thin film transistor and display apparatus having the same is substantially reduced and/or effectively minimized.

The present invention should not be construed as being limited to the exemplary embodiments set forth herein. Rather, these exemplary embodiments are provided so that this disclosure will be thorough and complete and will fully convey the concept of the present invention to those skilled in the art While the present invention has been particularly shown and described with reference to exemplary embodiments thereof, it will be understood by those of ordinary skill in the art that various changes and modifications in form and detail can be made therein without departing from the spirit or scope of the present invention as defined by the following claims.

What is claimed is:

1. A display apparatus comprising:
   a first substrate comprising a pixel area;
   a gate line formed on the first substrate;
   a data line formed on the first substrate, the data line being insulated from and intersecting the gate line;
   a gate electrode which extends from the gate line;
   a semiconductor layer formed on the gate electrode;
   a source electrode formed on the semiconductor layer and which extends from the data line;
   a drain electrode formed on the semiconductor layer and spaced apart from the source electrode;
   a pixel electrode formed in the pixel area and electrically connected to the drain electrode;
   a second substrate; and
   a common electrode formed on the second substrate substantially facing the pixel electrode, and wherein the data line, the source electrode and the drain electrode each comprise a copper layer pattern and a copper fluoride layer pattern formed on a surface of the copper layer pattern.

2. The display apparatus of claim 1, wherein the semiconductor layer comprises:
   a first semiconductor layer pattern formed on the gate electrode and comprising an intrinsic semiconductor; and
   a second semiconductor layer pattern comprising an impurity semiconductor, formed on the first semiconductor layer pattern and comprising:
   a first portion disposed substantially on the source electrode; and
   a second portion disposed substantially on the drain electrode.

3. The display apparatus of claim 2, wherein at least a portion of the second semiconductor layer pattern overlaps at least a portion of the data line, at least a portion of the source electrode and at least a portion of the drain electrode.

* * * * *